United States Patent [19]
Bechtel

[11] Patent Number: 5,350,908
[45] Date of Patent: Sep. 27, 1994

[54] AUTOMATIC GAIN CONTROL CIRCUIT HAVING DISTURBANCE CANCELLATION CAPABILITIES

[75] Inventor: Richard D. Bechtel, Waukesha County, Wis.

[73] Assignee: Allen-Bradley Company, Inc., Milwaukee, Wis.

[21] Appl. No.: 906,333

[22] Filed: Jun. 30, 1992

[51] Int. Cl.[5] .......................... H03G 3/32; G06K 7/10
[52] U.S. Cl. ..................................... 235/462; 330/129; 307/264
[58] Field of Search ................ 235/462; 330/279, 129; 307/264, 494, 493; 358/155, 157, 174, 177

[56] References Cited

U.S. PATENT DOCUMENTS

| | | | |
|---|---|---|---|
| 3,258,711 | 3/1963 | Searl et al. | 330/279 |
| 3,900,832 | 8/1975 | Hanchett | 235/462 |
| 3,930,256 | 12/1975 | Amemiya | 307/264 |
| 4,224,578 | 9/1980 | Bernitt | 330/129 |
| 4,433,304 | 2/1984 | Engle | 330/129 |
| 4,667,242 | 5/1987 | Hagino | 358/174 |
| 5,068,520 | 11/1991 | Sato | 235/462 |
| 5,128,629 | 7/1992 | Trinh | 330/129 |
| 5,191,407 | 3/1993 | Kawano et al. | 358/174 |

FOREIGN PATENT DOCUMENTS

| | | | |
|---|---|---|---|
| 0128215 | 11/1978 | Japan | 358/174 |
| 0215879 | 12/1983 | Japan | 358/177 |
| 0058934 | 2/1990 | Japan | 307/493 |

*Primary Examiner*—Davis L. Willis
*Assistant Examiner*—Edward Sikorski
*Attorney, Agent, or Firm*—John J. Horn; H. Frederick Hamann

[57] ABSTRACT

A system for filtering electrical signals and cancelling large amplitude disturbance events contaminating such signals which might otherwise interfere with these signals being further processed. The system includes a disturbance filter which is operative for identifying disturbance events and passing an inverted signal corresponding solely to these events to a summing junction for use in cancelling these events as they occur. In the preferred embodiment this system is adapted for use in a bar code reader.

18 Claims, 4 Drawing Sheets

AUTOMATIC GAIN CONTROL CIRCUIT HAVING DISTURBANCE CANCELLATION CAPABILITIES

BACKGROUND OF THE INVENTION

The present invention relates to systems for filtering electrical signals to remove interference and more particularly to systems for cancelling large amplitude disturbance events contaminating bar code signals.

Certain types of information signals such as the signals generated by bar code readers containing bar code information are characterized by noise containing occasional large amplitude disturbances which may interfere with the processing of these signals. In the past these disturbance events have been controlled by limiting signal amplitude to a maximum as a function of saturation effects whereby excursions are "truncated" at a fixed amplitude level. This approach is generally effective, however, the disturbance events still contaminate the signal even if they now have controlled amplitude. Therefore, these events can still cause problems such as overcompensation by gain control circuitry and excessive threshold elevation in threshold detection systems.

It is therefore an object of the present invention to provide a system for fully cancelling large scale disturbance events so that they do not contaminate information containing signals such as bar code signals.

It is another object of the present invention to provide a filter system which may be implemented in a bar code reader for cancelling disturbance events which would otherwise adversely affect automatic gain control functions.

It is a further object of the present invention to provide a filter system which may be implemented in a bar code reader for cancelling disturbance events which would otherwise adversely affect threshold detection operations.

It is yet another object of the present invention to provide a system for cancelling disturbance events contaminating information signals which is of simple design, is inexpensive to construct and is reliable in operation.

SUMMARY OF THE INVENTION

The present invention constitutes a system for filtering electrical signals and cancelling large disturbance events contaminating such signals which might otherwise interfere with such signals being further processed. The present invention comprises a disturbance filter which is operative for identifying disturbance events, inverting the voltage levels corresponding to these events and passing an inverted signal representing these events to a summing junction for use in cancelling these events.

In the preferred embodiment, the disturbance filter includes an operational amplifier circuit for inverting an input signal on its first input, a fixed voltage source and diode for clamping this input to a fixed voltage level for all signal amplitudes below this level and a level switching circuit coupled to the second input of the operational amplifier for shifting the level of the voltage applied to this input to ground whenever the signal applied to the first input exceeds the fixed voltage level supplied by way of the diode. The operational amplifier circuit inverts and passes on the input signal supplied to the disturbance filter only when the voltage amplitude of this signal exceeds the threshold level to which its first input is clamped thereby generating a cancellation signal which may be summed with the original input signal to accomplish cancellation of disturbance events so that such events are filtered out of the resulting output signal from the disturbance filter. The system of the present invention may be usefully employed in processing signals which are contaminated by large disturbance events such as signals in bar code readers and may be used in gain control circuitry for avoiding overcompensation or may be used in threshold detection systems for controlling disturbance events affecting threshold levels.

DESCRIPTION OF THE PREFERRED EMBODIMENT

Figure 1:
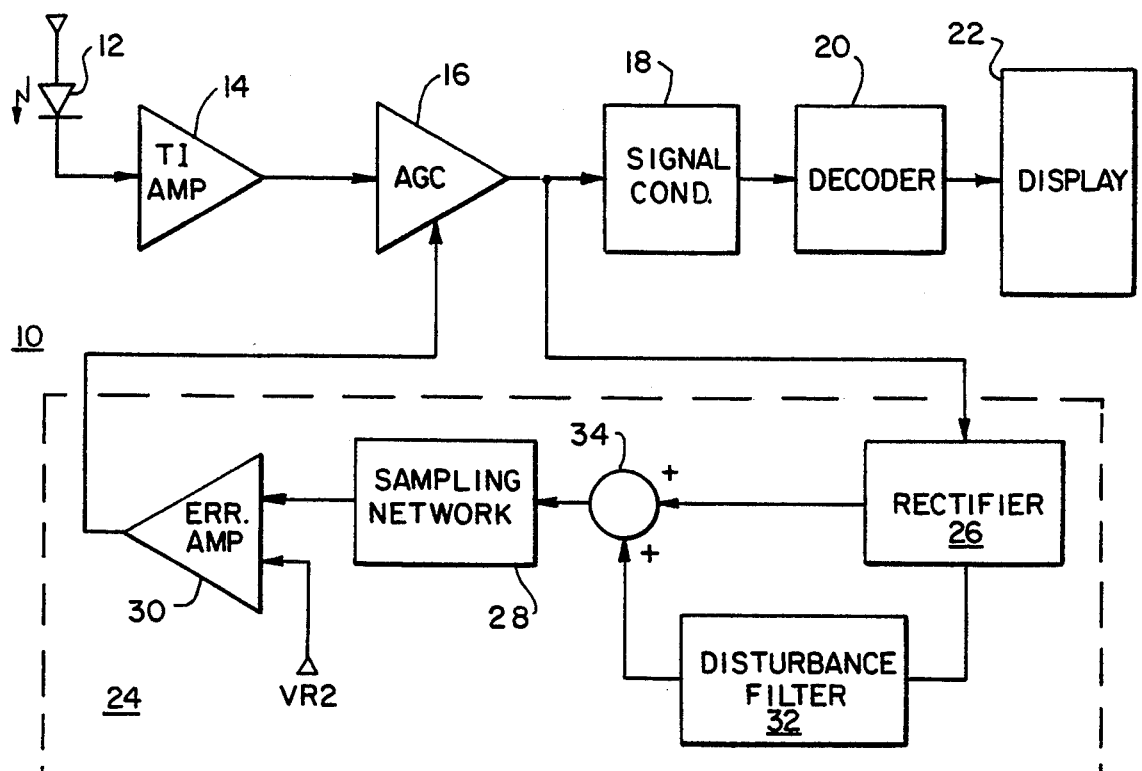
FIG. 1 provides a block diagram of a bar code reader employing a disturbance event cancellation system in accordance with the principles of the present invention.

Referring now to FIG. 1, a bar code reader 10 includes a photodiode 12 which is positioned for receiving reflected light signals including bar code information. The light comprising these signals modulates the current flowing through the diode 12 to generate an electrical signal which is passed to a transimpedance amplifier 14. The voltage signal produced by the transimpedance amplifier 14 is directed to an automatic gain control amplifier 16 for amplitude level control purposes and then passed on to signal conditioning circuitry 18 for detecting the bar code information. The bar code information is then decoded by a decoder 20 and provided to a visual display unit 22 for viewing by the operator of the bar code reader 10.

The automatic gain control amplifier 16 is provided with a gain control signal by the gain control circuitry 24 based on feedback of its output. The circuitry 24 includes a rectifier 26 for converting the output of the amplifier 16 to a rectified signal, a sampling network 28 for filtering this rectified signal and an error amplifier 30 for comparing the output of the sampling network to a voltage reference signal VR2 in order to generate a gain control signal for controlling the automatic gain control amplifier 16. The gain control circuitry 24 also includes a disturbance filter 32 which is configured for producing disturbance cancellation signals for combination with the direct output of the rectifier 26 at the summing junction 34 in order to cancel any large scale disturbance events contaminating this output. The disturbance filter 32 processes the output from the rectifier 26 to generate cancellation signals which are active during disturbance events and which are of equal amplitude and opposite polarity from the disturbance events. Consequently, such events are cancelled at the summing junction 34 and do not affect the gain control signals supplied to the gain control amplifier 16.

Figure 2:
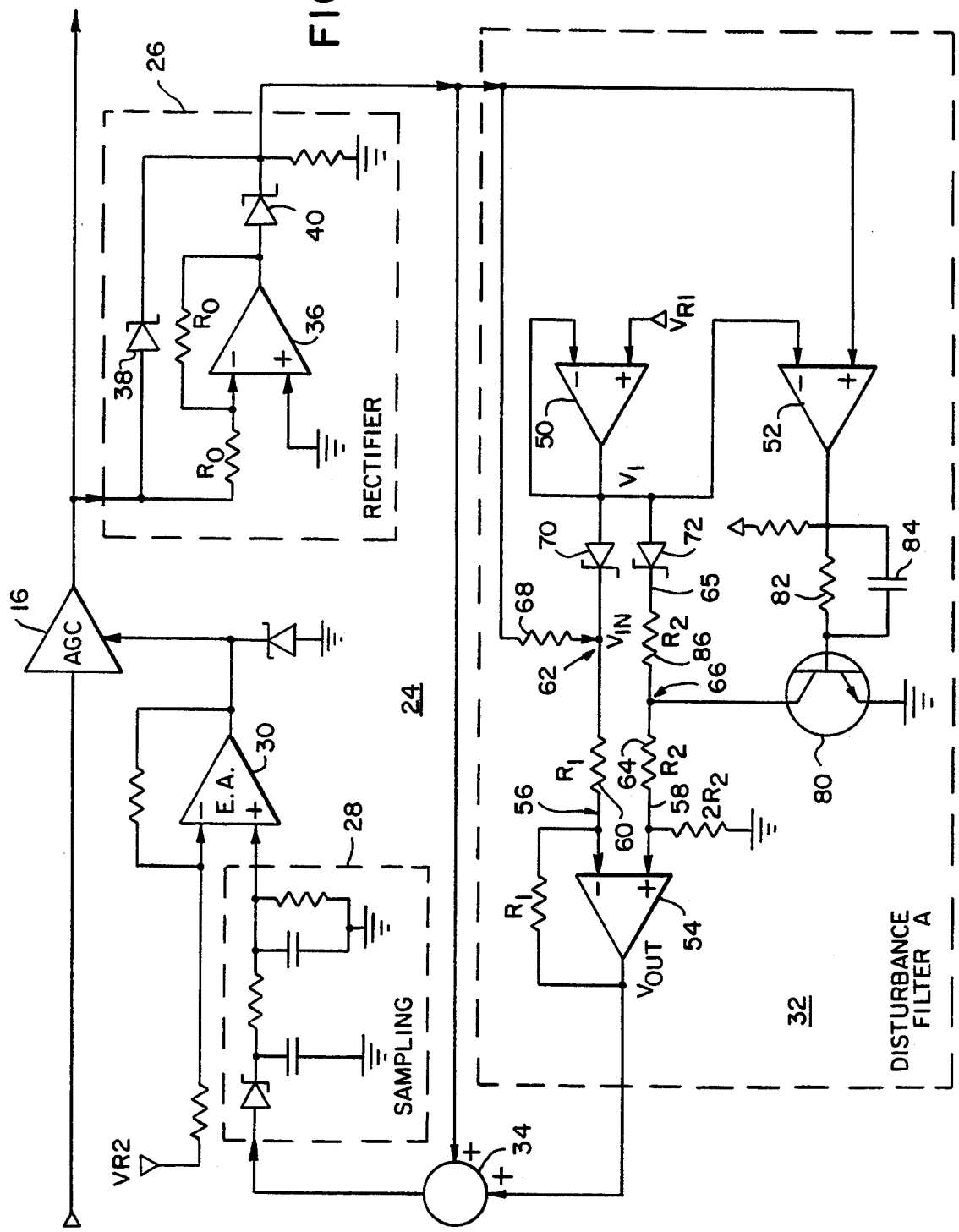
FIG. 2 provides a schematic diagram of one embodiment of the system of the present invention as used in an automatic gain control circuit for a bar code reader of the type shown in FIG. 1.

Referring now to FIG. 2, the circuitry 24 is shown in greater detail with reference to the automatic gain control amplifier 16. The references $R_0$, $R_1$, $R_2$ and $R_3$ indicate the constant resistance values of the resistors they are adjacent to. The rectifier 26 comprises a full wave rectifier in which the operational amplifier 36 is configured as an inverter. Positive polarity signals appearing on the output of the amplifier 16 are passed to the output of the rectifier 26 by the Schottky diode 38 while negative polarity signals appearing on the output of the amplifier 16 are inverted by the operational amplifier 36 and then passed to the output of the rectifier 36 by the Schottky diode 40.

The rectified signal which constitutes the output of the rectifier 26 is supplied to both the summing junction 34 and the disturbance filter 32. The disturbance filter 32 includes an operational amplifier 50 which has its inverting input connected to its output and its non-inverting input connected to a voltage source for receiving the reference signal VR1 so as to be configured for steadily maintaining its output at the fixed voltage level V1. The disturbance filter 32 also includes an operational amplifier 52 which is configured as a comparator for comparing the output of the amplifier 50 which is supplied to its inverting input with the output of the rectifier 26 which is supplied to its non-inverting input. The filter 32 further includes an operational amplifier 54 which is configured as a differencing amplifier for inverting the rectified signal from the rectifier 26 having its inverting input 56 connected through the input resistor 60 to the node 62 and its non-inverting input 54 connected through the input resistor 64 to the node 66.

The rectified signal which constitutes the output of the rectifier 26 is also supplied to the node 62 through the isolation resistor 68. However, the Schottky diode 70 clamps the level of the node 62 to the output level V1 of the amplifier 50 whenever the amplitude level of the output level of the rectifier 6 is below the voltage V1 maintained by the amplifier 50. Nevertheless, when the level of the output signal of the rectifier 26 rises above the voltage level V1, the diode 70 serves to isolate the node 62 from the output of the amplifier 50 and the voltage level $V_{IN}$ at the node 62 is governed by the output of the rectifier 26 and the output of the rectifier is applied to the input 56 to the amplifier 54 through the resistor 60.

The bipolar transistor 80 has its base connected to the output of the amplifier 52 through the resistor 82 and capacitor 84, which serves to compensate for saturation effects when the transistor 80 is being turned on and off, and has its collector connected to the node 66 and its emitter connected to ground. Whenever the output of the operational amplifier 52 goes high, the transistor 80 is turned on and the node 66 is connected directly to ground thereby also pulling the voltage level at the input 58 to the amplifier 54 to near ground levels. Therefore, when the voltage level of the output signal from the rectifier 26 is less than the voltage V1, the amplifier 52 (which operates as a comparator) provides a low level signal which leaves the transistor 80 turned off isolating the node 66 from ground and allowing the voltage level V1 to be passed from the output of the amplifier 50 through the Schottky diode 72 and the resistors 86 and 64 onto the input 58 to the amplifier 54. However, when the level of the output signal of the rectifier 26 exceeds the voltage V1, the amplifier 52 provides a high level signal which turns on the transistor 80 thereby grounding the node 62 and the input 58 to the amplifier 54.

The overall operation of the disturbance filter 32 can now be understood as dependent on the relationship of the signal level of the output of the rectifier 26 and the level of the fixed voltage V1. When the amplitude level of the output of the rectifier 26 is below the voltage level V1, the voltage level V1 is applied to node 62 and node 65 which are coupled to inputs 56 and 58 and therefore the amplifier 54 provides a zero voltage level output. On the other hand, when the voltage level of the output of the rectifier 26 exceeds the voltage level V1, the output signal from the rectifier 26 is supplied onto the input 56 to the amplifier 54 while the other input 58 to the amplifier 54 is effectively connected to ground. The amplifier 54 accordingly inverts and passes the output signal from the rectifier 26 onto the summing junction 34 whenever this signal exceeds the voltage level V1 (but only during periods when it in fact does exceed the voltage level V1). Since the voltage level V1 is adjusted to correspond to disturbance events and the output of the rectifier 26 is also provided as a direct input to the junction 34, during disturbance events equal but opposite polarity signals are provided by the rectifier 26 and disturbance filter 32 to the summing junction 34 thereby resulting in cancellation of such disturbance events in the output of the summing junction 34 which is supplied to the sampling network 28. Consequently, as the sampling network 28 filters the output of the summing junction 34 and supplies the same to the error amplifier 30, disturbance events beyond the threshold voltage level V1 are eliminated as a factor in generating the feedback signal for controlling the gain of the amplifier 16 thereby allowing the automatic gain control circuitry for the bar code reader 10 to be more responsive despite the occurrence of occasional disturbance events.

Figure 3:
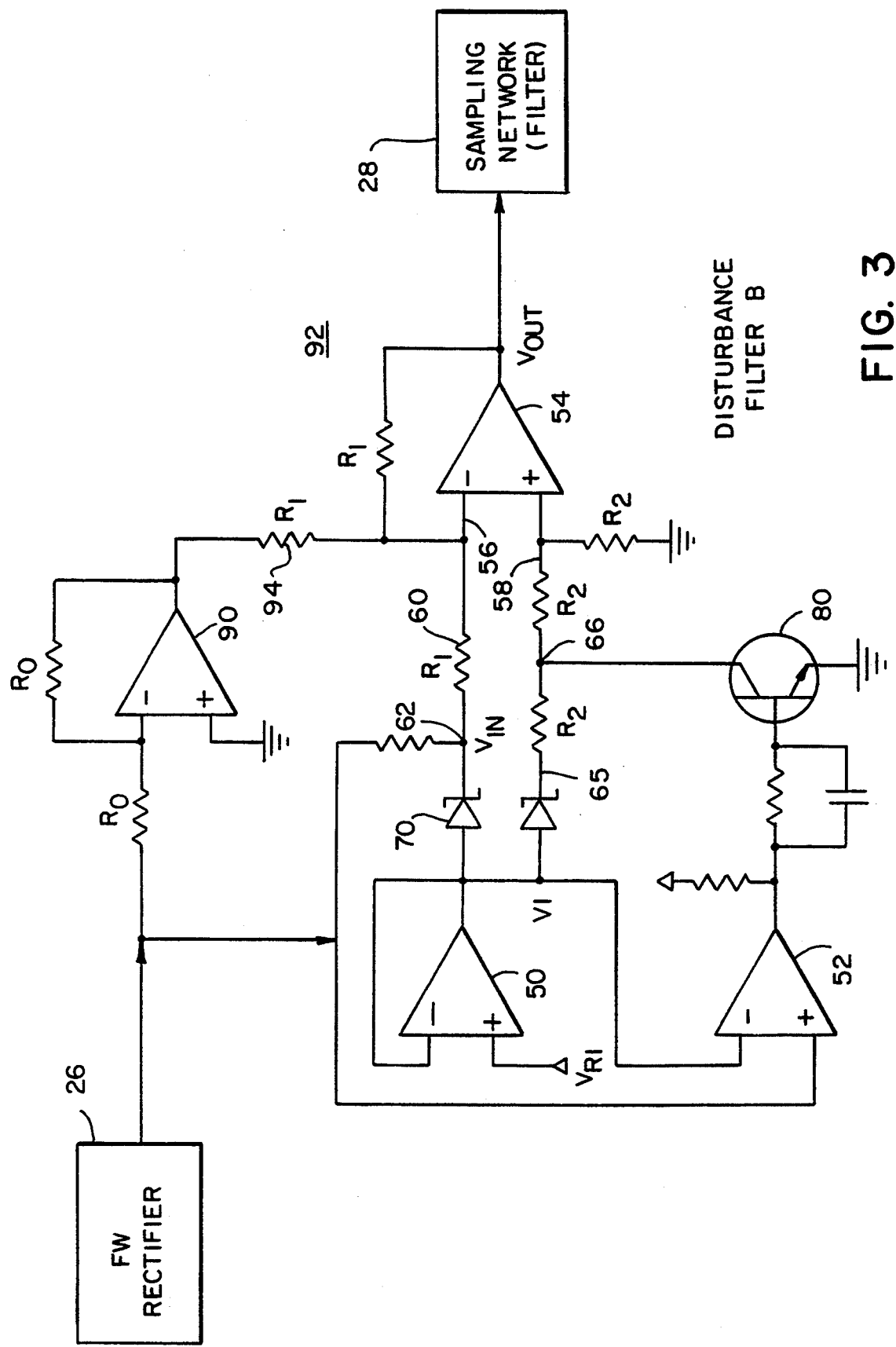
FIG. 3 provides a schematic diagram of an alternate embodiment of the system of the present invention in which components of the disturbance filter are used to combine the cancellation signal with the rectified signal.

Referring now to FIG. 3, the disturbance filter 92 includes amplifiers 50, 52 and 54 as well as diode 70, bipolar transistor 80 and associated components which operate in a fashion similar to the same elements shown in FIG. 2. The references $R_0$, $R_1$, $R_2$ and $R_3$ indicate the constant resistance values of the resistors they are adjacent to. The amplifier 50 is operative for maintaining its output at a fixed voltage level V1. The amplifier 52 is functional for comparing the voltage level of the output of the rectifier 26 with the voltage level V1 and turning the transistor 80 on and off in accordance with whether the output level of the rectifier 26 is above or below the voltage level V1. The transistor 80 shunts the node 66 to ground when it is turned on whenever the output of the rectifier is above the voltage level V1. The diode 70 works in combination with the amplifier 50 to clamp the voltage level of the node 62 to level V1 whenever the amplitude level of the output of the rectifier 26 is below V1 and otherwise isolates the node 62 from the output of the amplifier 50 whenever the amplitude level of the output of the rectifier 26 is above V1. The operating amplifier 90 is configured as an inverting amplifier for inverting the polarity of the output of the rectifier 26 and supplying the resulting signal onto the input 56 of the amplifier 54. The amplifier 54 is now operative for summing the input voltages received from the amplifier 90 by way of the resistor 94 and from the node 62 by way of the resistor 60 and then differencing the signals with the voltage on input 58 in order to generate an output signal for direct supply to the sampling network 28. Since the amplifiers 54 and 90 are configured as differencing and inverting amplifiers, the output signal from the rectifier 26 is passed to the sampling network 28 with correct polarity whenever the amplitude level of this signal is below the voltage V1. However, when the amplitude level of the output signal of the rectifier 26 is above V1, input 58 to the amplifier 54 is pulled to ground level while the node 62 is isolated by the diode 70 from the output of the amplifier 50 allowing an output signal from the rectifier 26 to be directed to the input 56 to the amplifier 54 by way of the node 62 for combination with the output of the amplifier 90 (which is of opposite polarity). Therefore, the currents into the node represented by input 56 of the amplifier 54 are summed to zero during disturbance events characterized by amplitude levels above voltage level V1 and the amplifier 54 provides a zero level signal to the sampling network 28. The configuration of the filter 92 including the additional amplifier 90 allows for the summing junction 34 to be eliminated as its function is effectively incorporated into the operation of the amplifier 54.

Figure 4:
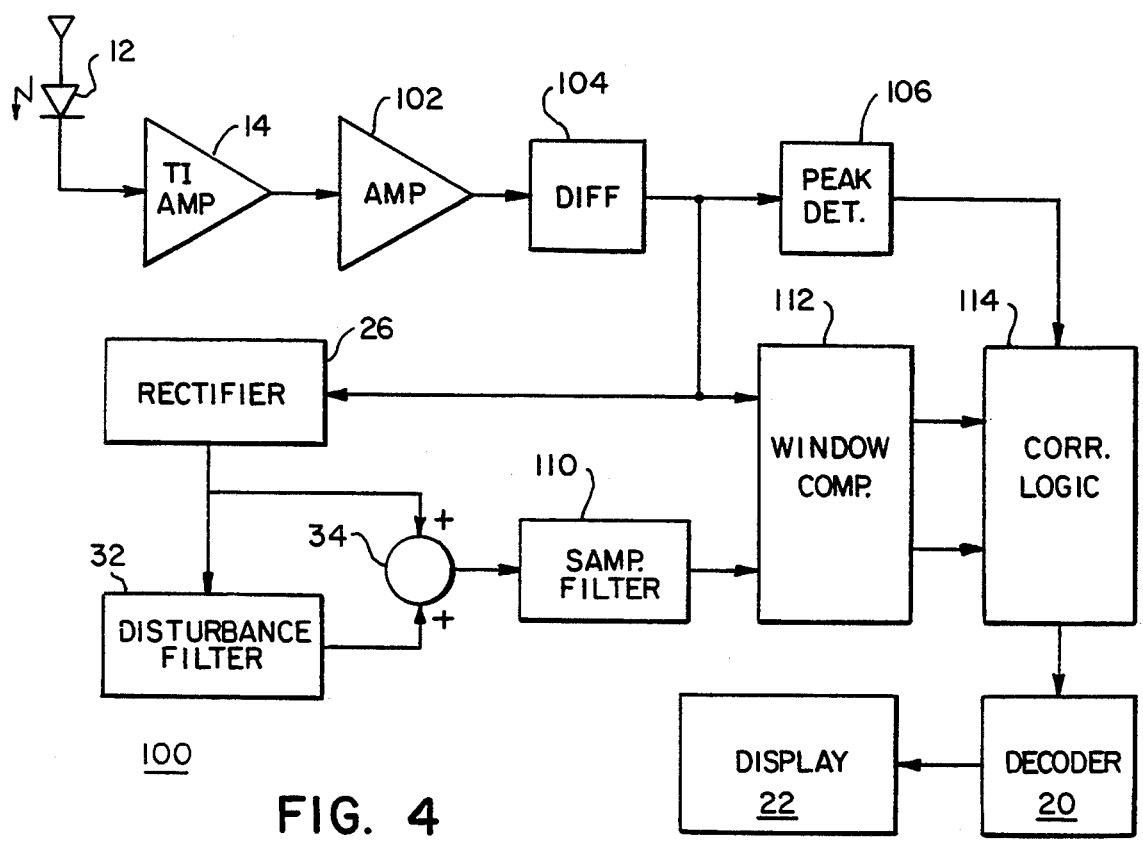
FIG. 4 provides a block diagram of an alternative type of bar code reader operating in accordance with threshold detection principles in which the disturbance event cancellation system of the present invention may also be usefully employed.

Referring now to FIG. 4, a bar code reader 100 is shown which operates in accordance with threshold detection principles but which can be subject to having its operation disrupted by disturbance events although in a somewhat different manner from the bar code reader 24. The amplifier 100 includes a photodiode 12 which passes signals to a transimpedance amplifier 14 which in turn feeds a voltage amplifier 102. The signals from the voltage amplifier 102 are provided to a differentiater 104 which generates an output signal as a function of the rate of change of its input.

The output of the differentiater 104 is applied to a peak detector 106, a window comparator 112 and a full wave rectifier 26. The full wave rectifier 26 generates a rectified signal based on the output of the differentiater 104 which is supplied to the disturbance filter 32 and the summing-junction 34. The disturbance filter 32 also provides an output to the summing junction 34 for use in cancelling disturbance events. The disturbance filter 32 may be structured as shown in FIG. 2 to provide a signal to the summing junction 34 which is adapted for cancelling disturbance events. The output of the summing junction 34 is supplied to a sampling filter 110 having variable attack and decay characteristics which generates a filtered output for supply to the window comparator 112 for use in setting the threshold levels for comparison operations by the window comparator 112. Signals from the peak detector 106 and the window comparator 112 are provided to the correlation logic circuitry 114 where they are processed to identify bar code signal events. Bar code information from the logic circuitry 114 is passed to the decoder 20 for decoding and is then supplied to a visual display 22. The bar code reader 100 illustrates an alternative application of the disturbance cancellation principles of the present invention to a different type of bar code reader.

Figure 5:
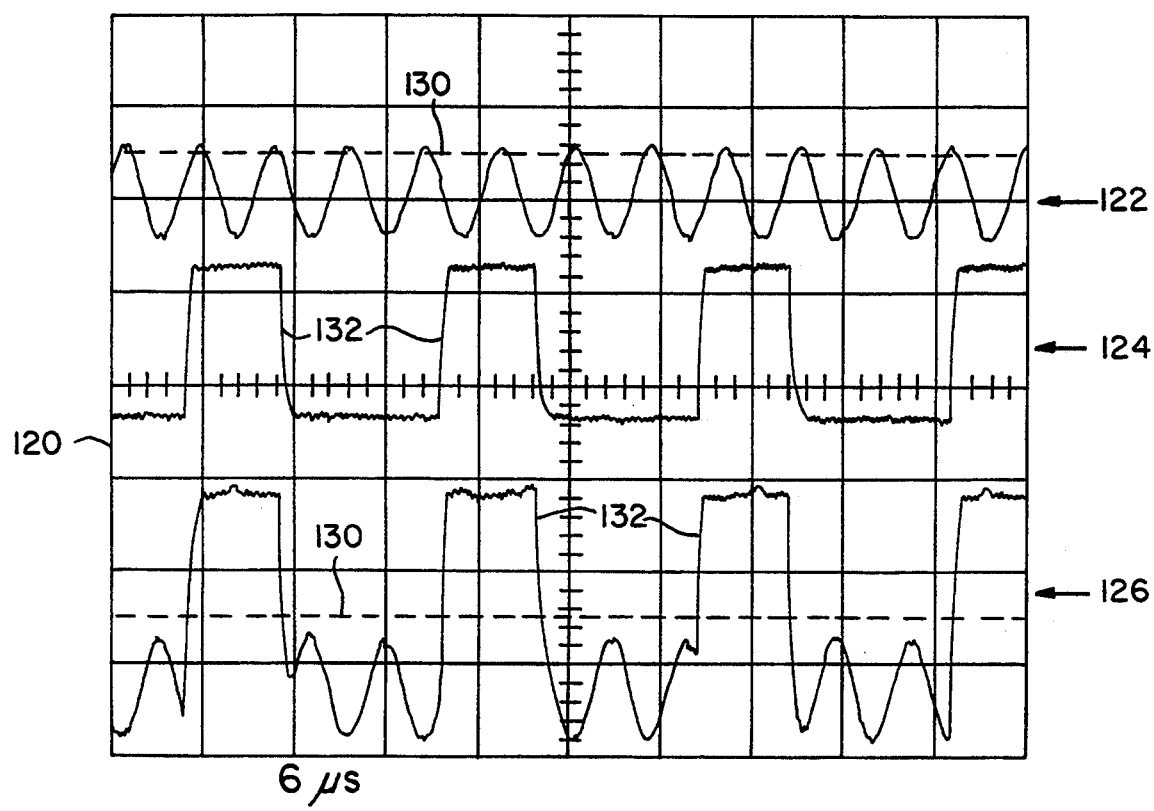
FIG. 5 provides a graphical representation of the operation of the present invention in accordance with experimental results illustrating how the invention avoids overcompensation in automatic gain control circuits.

Referring now to FIG. 5, the wave forms 122, 124 and 126 on graph 120 correspond to bar code signals. The wave form 122 represents a desired bar code signal of the type which would be produced by the automatic gain control amplifier 16 of FIG. 1 under normal conditions having an amplitude 130 appropriate for processing by the signal conditioner 18. The wave form 124 represents the output of the amplifier 16 when periodically subject to large disturbance events which cause the gain control circuitry associated with the amplifier 16 to overcompensate and reduce the desired signal to a very low amplitude level insufficient for reliable processing by the signal conditioner 18. The waveform 126 represents the output of the amplifier 16 in accordance with the signal cancellation principles of the present invention whereby overcompensation by the gain control circuitry is avoided and the desired signal is maintained near to the level 130 desired for proper processing by the signal conditioner 18 despite the presence of disturbance events 132.

While particular embodiments of the present invention have been shown and described, it should be clear that changes and modifications may be made to such embodiments without departing from the true scope and spirit of the invention. For example, in the embodiment of FIG. 2, the threshold signal for use by the amplifier 52 in its comparison functions could be established by sampling the input to the AGC amplifier 16 in order to set a threshold based on the most frequently occurring peaks and thereby improve the dynamic range of the AGC system. It is intended that the appended claims cover all such changes and modifications.

I claim:

1. An automatic gain control circuit having disturbance cancellation capabilities, comprising:

a variable-gain amplifier having an input for receiving an input signal to be amplified for gain control purposes, an output for supplying a gain-controlled output signal and a gain control terminal;

a rectifier having its input connected to the output of said variable-gain amplifier for providing a rectified signal based on the output signal of said amplifier;

a sampling network for generating a filtered output signal from said rectified signal;

an error amplifier having an input coupled for receiving said filtered output signal of said sampling network and an output connected to said gain control terminal, said error amplifier adapted for amplifying the output of said sampling network based on a difference with a reference signal and applying the resulting error signal to said gain control terminal;

a differencing amplifier having a first input coupled for receiving said rectified signal, a second input connected to a level switching network and an output coupled to said sampling network for supplying a disturbance cancellation signal for combination with said rectified signal;

means for clamping the first input to said differencing amplifier to a fixed voltage level for all signal levels at said input below said voltage level; and a level switching network connected to the second input to said differencing amplifier for applying a voltage signal to said second input and for shifting the level of this voltage signal between said fixed voltage level and ground based on the level of said rectified signal.

2. The automatic gain control circuit of claim 1, wherein said level switching network includes a comparator for comparing said rectified signal to said fixed voltage level from said means for clamping and a switching transistor controlled by said comparator for connecting the second input of said differencing amplifier to ground when said rectified signal exceeds said fixed voltage level.

3. The automatic gain control circuit of claim 1, wherein said sampling network includes an RC filter.

4. The automatic gain control circuit of claim 1, wherein said means for clamping includes an operational amplifier which is connected to a voltage reference source and is configured as a voltage follower and a diode connected between said operational amplifier and said first input of said differencing amplifier.

5. A bar code reader, comprising:
- a photodiode for detecting light signals encoded with bar code information;
- a variable-gain amplifier for amplifying signals from said photodiode having a gain control terminal and an output for supplying an amplified bar code signal;
- a rectifier for converting said amplified bar code signal from said variable-gain amplifier to a rectified signal;
- a sampling network for filtering said rectified signal from said rectifier to generate a sampled signal;
- an error amplifier for amplifying said sampled signal from said network and applying the resulting error signal to said gain control terminal;
- means for detecting disturbance events in said rectified signal as they occur, inverting these disturbance signals to form inverted signals during such events and summing these inverted signals with the rectified signal from said rectifier before this signal is applied to said sampling network in order to cancel the disturbance events in said rectified signal from said rectifier; and
- means for decoding said bar code signal to identify said bar code information.

6. The bar code reader of claim 5, wherein said means for detecting, inverting and summing includes:
- a differencing amplifier having a first input coupled for receiving said rectified signal, a second opposite polarity input and an output coupled to said sampling network,
- means for clamping said first input to a fixed voltage level for all amplitude levels of said rectified signal below said fixed voltage level, and
- level switching means coupled to the second input to said differencing amplifier for supplying a voltage signal to said second input and shifting the level of this voltage signal between said fixed voltage level and ground based on the level of said rectified signal.

7. The bar code reader of claim 6, wherein said level switching network includes a comparator for comparing the amplitude level of said rectified signal to said fixed voltage level from said means for clamping and a switching transistor controlled by said comparator for connecting the second input of said differencing amplifier to ground when said rectified signal exceeds said fixed voltage level.

8. An automatic gain control circuit having disturbance cancellation capabilities, comprising:
- a variable-gain amplifier having an input for receiving an input signal to be amplified for gain control purposes, an output for supplying a gain-controlled output signal and a gain control terminal;
- a rectifier having its input connected to the output of said variable-gain amplifier for providing a rectified signal based on the output signal of said amplifier;
- a sampling network for generating a filtered output signal from said rectified signal;
- an error amplifier having an input coupled for receiving said filtered output signal of said sampling network and an output connected to said gain control terminal, said error amplifier adapted for amplifying the output of said sampling network based on a difference with a reference signal and applying the resulting error signal to said gain control terminal;
- a differencing amplifier having a first input coupled for receiving said rectified signal, a second input connected to a level switching network and an output coupled to said sampling network for supplying an output signal in which major disturbance events have been cancelled to said sampling network;
- an inverting amplifier having an input connected to said rectifier for receiving said rectified signal and an output connected to said first input of said differencing amplifier;
- means for clamping the first input to said differencing amplifier to a fixed voltage level for all signal levels below said voltage level; and
- a level switching network connected to the second input to said differencing amplifier for applying a voltage signal to said second input and for shifting the level of this voltage signal between said fixed voltage level and ground based on the level of said rectified signal.

9. The automatic gain control circuit of claim 8, wherein said level switching network includes a comparator for comparing the amplitude level of said rectified signal to said fixed voltage level from said means for clamping and a switching transistor controlled by said comparator for connecting the second input of said differencing amplifier to ground when said rectified signal exceeds said voltage level.

10. The automatic gain control circuit of claim 8, wherein said sampling network includes an RC filter.

11. The automatic gain control circuit of claim 8, wherein said means for clamping includes an operational amplifier which is connected to a voltage reference source and is configured as a voltage follower and a diode connected between said operational amplifier and said first input of said differencing amplifier.

12. A disturbance filter for processing signals containing large amplitude disturbance events, comprising:
- a differencing amplifier having a first input coupled for receiving an input signal, a second opposite polarity input connected to a level switching network and an output for supplying an output signal including only disturbance events;
- means for clamping coupled to said first input to said differencing amplifier for clamping this input to a fixed voltage level when said input signal is below said fixed voltage level; and
- a level shifting network coupled to the second input of said differencing amplifier for supplying a voltage signal to said second input and shifting the level of this voltage signal from said fixed voltage level to ground whenever said input signal exceeds said fixed voltage level and from ground to said fixed voltage level whenever said input signal is below said fixed voltage level.

13. The disturbance filter of claim 12, wherein said level switching network includes a comparator for comparing said input signal to said fixed voltage level from said means for clamping and a switching transistor controlled by said comparator for connecting the second input of said inverter to ground when said input signal exceeds said fixed voltage level.

14. The disturbance filter of claim 12, wherein said means for clamping includes an operational amplifier which is connected to a voltage reference source and is configured as a voltage follower and a Schottky diode connected between said operating amplifier and said first input of said differencing amplifier.

15. The disturbance filter of claim 12, further including means for summing said output signal from said differencing amplifier with said input signal to form a filtered signal in which disturbance event signals are not present.

16. A bar code reader comprising:
a photodiode positioned for receiving light signals containing bar code information and generating an electrical signal based on these light signals;
a differentiater for generating a differentiated signal as a function of the rate of change of said electrical signal;
a peak detector for generating a peak identification signal based on said differentiated signal;
a rectifier for generating a rectified signal from said differentiated signal;
means for generating a disturbance cancellation signal from said rectified signal;
a summing junction for combining said rectified signal and said cancellation signal to generate a combined signal which is free from large amplitude disturbance events;
a sampling network for generating a filtered signal by low pass filtering said combined signal;
a window comparator for generating threshold detection signals by comparing the amplitude of said rectified signal to thresholds set as a function of said filtered signal; and
correlation circuitry for detecting bar code signals by processing and correlating said peak identification and threshold detection signals.

17. The bar code reader of claim 16, further including means for decoding and displaying said bar code signals.

18. The bar code reader of claim 16, wherein said means for generating a disturbance cancellation signal includes:
an operational amplifier having a first input coupled for receiving said rectified signal, a second opposite polarity input connected to a level switching network and an output from which said disturbance cancellation signal is supplied to said summing junction;
means for clamping coupled to said first input to said amplifier for clamping this input to a fixed voltage level when said rectified signal is below said fixed voltage level; and
a level shifting network coupled to the second input of said amplifier for supplying a voltage signal to said second input and shifting the level of this voltage signal from said fixed voltage level to ground whenever said rectified signal exceeds said voltage fixed level and from ground to said fixed voltage level whenever said input signal is below said fixed voltage level.

* * * * *